United States Patent
Rae et al.

(10) Patent No.: US 9,985,010 B2
(45) Date of Patent: May 29, 2018

(54) SYSTEM, APPARATUS, AND METHOD FOR EMBEDDING A DEVICE IN A FACEUP WORKPIECE

(71) Applicant: QUALCOMM Incorporated, San Diego, CA (US)

(72) Inventors: David Fraser Rae, San Diego, CA (US); Lizabeth Ann Keser, San Diego, CA (US); Reynante Tamunan Alvarado, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 33 days.

(21) Appl. No.: 14/859,316

(22) Filed: Sep. 20, 2015

(65) Prior Publication Data
US 2016/0343635 A1 Nov. 24, 2016

Related U.S. Application Data

(60) Provisional application No. 62/165,809, filed on May 22, 2015.

(51) Int. Cl.
*H01L 23/538* (2006.01)
*H01L 25/16* (2006.01)
(Continued)

(52) U.S. Cl.
CPC .............. *H01L 25/16* (2013.01); *H01L 21/31* (2013.01); *H01L 21/31116* (2013.01); *H01L 21/4846* (2013.01); *H01L 21/561* (2013.01); *H01L 21/568* (2013.01); *H01L 23/5389* (2013.01); *H01L 24/19* (2013.01); *H01L 24/20* (2013.01);
(Continued)

(58) Field of Classification Search
CPC ..... H01L 21/31; H01L 21/565; H01L 23/528; H01L 27/0629; H01L 27/0676; H01L 27/0716; H01L 27/0722; H01L 27/0727; H01L 27/0733; H01L 27/0788; H01L 27/0794; H01L 27/1255; H01L 27/3265; H01L 25/16
See application file for complete search history.

(56) References Cited

U.S. PATENT DOCUMENTS 8,350,381 B2   1/2013   Theuss
8,624,370 B2   1/2014   Chi et al.
(Continued)

OTHER PUBLICATIONS

International Search Report and Written Opinion—PCT/US2016/033264—ISA/EPO—dated Aug. 18, 2016.

*Primary Examiner* — Daniel Luke
*Assistant Examiner* — Khatib Rahman
(74) *Attorney, Agent, or Firm* — Muncy, Geissler, Olds & Lowe, P.C.

(57) ABSTRACT

An integrated package may be manufactured in a die face up orientation with a component proximate to the attached die by creating a cavity in the mold compound during fabrication. The cavity is created with an adhesive layer on the bottom to hold a component such that the top surface of the component is co-planar with the top surface of the attached die. This may allow backside grinding to take place that will not damage the component because the top surface alignment between the attached die and the component prevents the depth of the cavity from extending into the portion of the package that is ground away.

18 Claims, 10 Drawing Sheets

(51) Int. Cl.
  *H01L 21/311* (2006.01)
  *H01L 21/31* (2006.01)
  *H01L 21/48* (2006.01)
  *H01L 21/56* (2006.01)
  *H01L 23/00* (2006.01)
  *H01L 23/498* (2006.01)

(52) U.S. Cl.
  CPC .............. *H01L 24/96* (2013.01); *H01L 24/97* (2013.01); *H01L 23/49816* (2013.01); *H01L 2224/04105* (2013.01); *H01L 2224/12105* (2013.01); *H01L 2224/24137* (2013.01); *H01L 2224/24195* (2013.01); *H01L 2224/32225* (2013.01); *H01L 2224/73267* (2013.01); *H01L 2224/75* (2013.01); *H01L 2224/83005* (2013.01); *H01L 2224/83192* (2013.01); *H01L 2224/92244* (2013.01); *H01L 2224/97* (2013.01); *H01L 2924/1431* (2013.01); *H01L 2924/1434* (2013.01); *H01L 2924/15153* (2013.01); *H01L 2924/1815* (2013.01); *H01L 2924/18162* (2013.01); *H01L 2924/19041* (2013.01); *H01L 2924/19042* (2013.01); *H01L 2924/19043* (2013.01); *H01L 2924/19105* (2013.01)

(56) References Cited

U.S. PATENT DOCUMENTS

| | | | |
|---|---|---|---|
| 8,680,683 B1 * | 3/2014 | Juskey | H01L 23/49822 257/690 |
| 8,822,268 B1 | 9/2014 | Magnus | |
| 8,932,907 B2 | 1/2015 | Cho et al. | |
| 2009/0065927 A1 | 3/2009 | Meyer | |
| 2014/0144676 A1 * | 5/2014 | Chung | H05K 1/186 174/251 |
| 2014/0252655 A1 | 9/2014 | Tran et al. | |
| 2014/0353836 A1 | 12/2014 | O'Sullivan et al. | |
| 2015/0076700 A1 * | 3/2015 | Yap | H01L 25/16 257/773 |

* cited by examiner

SYSTEM, APPARATUS, AND METHOD FOR EMBEDDING A DEVICE IN A FACEUP WORKPIECE

CLAIM OF PRIORITY UNDER 35 U.S.C. § 119

The present Application for Patent claims priority to Provisional Application No. 62/165,809 entitled "SYSTEM, APPARATUS, AND METHOD FOR EMBEDDING A DEVICE IN A FACEUP WORKPIECE" filed May 22, 2015, and assigned to the assignee hereof and hereby expressly incorporated by reference herein.

FIELD OF DISCLOSURE

This disclosure relates generally to integrated packages and more specifically, but not exclusively, to face up integrated packages.

BACKGROUND

Integrated packages, such as a fan out wafer level package (FOWLP), are generally manufactured with the active face of the device in a face down orientation. However, recent trends in semiconductor manufacturing are shifting towards manufacturing integrated packages in a device face up orientation. Face up technology enables a very flat surface on the active side of the die during redistribution line (RDL) processing that facilitates fine line and space and, due to the mold compound covering the surface of the device and a copper pillar structure connecting the die pad to the RDL, and may have board level reliability benefits compare to face down packages. Face-up packages are fabricated with the active surface of the die facing upward relative to the work piece carrier during molding and post mold grind before formation of the RDL. The carrier possesses a temporary adhesive layer that serves keep the die/components at the desired location during molding. After molding, the topside of the mold material is ground to reveal the active device. The carrier and temporary adhesive layer are removed before or after topside grinding. After RDL processing, the work piece is ground from the backside of the package/die to the final thickness. Using a thick die and work piece helps prevent die damage during placement, can reduce die movement during molding, and reduces the risk of work piece damage and yield loss during RDL processing. If traditional passive components are placed next to the die on the carrier's adhesive layer, it is impossible to grind the package to the desired thickness without damaging the passive component and compromising its function.

Accordingly, there is a need for systems, apparatus, and methods that allow face up semiconductor manufacturing with backside grinding that does not damage nearby components including the methods, system and apparatus provided hereby.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In one aspect, an integrated package includes: a die with an active side and a plurality of interconnects that extend from the active side of the die; a mold compound with a cavity, the mold compound at least partially covering the die; a component in the cavity; a dielectric layer on the mold compound, the dielectric layer configured to extend into the cavity such that the component is isolated from the mold compound; and a redistribution layer in the dielectric layer, the redistribution layer configured to couple the plurality of interconnects to the component.

In another aspect, a method for manufacturing an integrated package includes: placing a die on a carrier, the die having an active side; coupling a plurality of interconnects to the active side of the die; applying a mold compound on the carrier over the die; removing a portion of the mold compound to expose the plurality of interconnects; forming a cavity in the mold compound, where forming the cavity comprises extending the cavity into the mold compound a first distance less than a thickness of the mold compound; forming an adhesive layer on a surface of the cavity; placing a component on the adhesive layer in the cavity; forming a dielectric layer on the mold compound, where forming the dielectric layer comprises extending the dielectric layer into the cavity and isolating the component from the mold compound; and forming a redistribution layer in the dielectric layer, the redistribution layer coupling the plurality of interconnects to the component.

In still another aspect, an integrated package includes: a die with an active side; means for interconnection of the die that extends from the active side of the die; means for encapsulation of at least part of the die; a component in a cavity of the means for encapsulation; means for isolation on the means for encapsulation, the means for isolation extends into the cavity such that the component is isolated from the means for encapsulation; and means for coupling the die to the component, the means for coupling in the dielectric layer.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein advantageously address the industry needs, as well as other previously unidentified needs, and mitigate shortcomings of the conventional methods, apparatus, and systems. For example, an integrated package may be manufactured in a face up orientation without damaging a component proximate to the attached die by creating a cavity in the mold compound during fabrication. The cavity is created with an adhesive layer on the bottom to hold a component (such as another die or a passive component like a capacitor) such that the top surface of the component is co-planar with the top surface of the attached die. This may allow backside grinding to take place that will not damage the component because the top surface alignment between the attached die and the component prevents the depth of the cavity from extending into the portion of the package that is ground away. Some advantages of the present disclosure over traditional solutions includes, but is not limited to, a face-up die placement FOWLP that allows for a flat molding surface after grinding resulting in the ability to do much finer lines and spaces than face-down solutions; a face-up die has better electrical performance due to the insulating layer on the surface of the die and the thick Cu pillar on the die; a smaller footprint than traditional packaging solutions, and a better board level reliability using a face-up structure.

Figure 1:
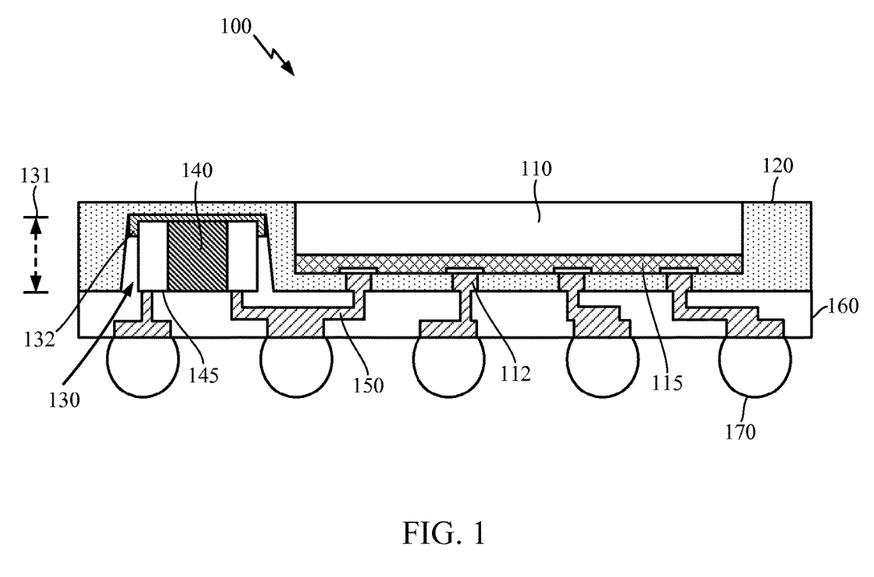
FIG. 1 illustrates an exemplary integrated package with a face up die coupled to a nearby component located in a cavity of the mold compound in accordance with some examples of the disclosure.

FIG. 1 illustrates an exemplary integrated package with a face up die coupled to a nearby component located in a cavity of the mold compound in accordance with some examples of the disclosure. As shown in FIG. 1, an integrated package 100 may include a die 110 having an active side 115 and a plurality of interconnects 112 (e.g. pads, traces, vias, pillars, electrical conductors etc.) extending from the active side 115, and a mold compound 120 at least partially covering the die 110. The active side 115 is the part of the die 110 that contains the active components of the die 110 (e.g. transistors, resistors, capacitors etc.), which perform the operation or function of the die 110. The mold compound 120 has a cavity 130 nearby or spaced from the die 110 and component 140 located in the cavity 130. Redistribution layers (e.g. one or more metal layers) may electrically couple the die 110 to the component 140 or may electrically couple the die 110 and the component 140 to any other device coupled to the integrated package 100 (e.g. through interconnects 112 and/or through solder balls 170). A dielectric layer 160 at least partially surrounds the RDL layers 150 and may be formed on a surface of the mold compound 120. The integrated package may also have a plurality of solder balls 170 on the dielectric layer 160 coupled to the redistribution layer 150 for external connections.

The cavity 130 may have an opening co-planar with the plurality of interconnects 112 and the cavity may extend from the opening a first distance 131 into the mold compound 120 such that the first distance 131 is less than a thickness of the mold compound 120. The component 140 may be located in the cavity 130 such that at least a portion of a connection 145 (e.g. port, electrode, interconnects etc.) of the component 140 is co-planar with the plurality of interconnects 112. In addition, the cavity 130 may have an adhesive layer 132 (e.g. die attach film or adhesive paste) on at least a portion of its surface that secures the component 140 in the cavity 130 and a portion of the dielectric layer 160 may extend into the cavity to isolate sides of the component 140 from the mold compound 120. The redistribution layer 150 may be coupled to the plurality of interconnects 112 and the component 130 providing an electrical pathway for signals between the die 110 and the component 130 as well as external connections. The die 110 may be a logic die or similar integrated circuit component and the component 140 may be a logic die, a memory, pre-formed via bars (e.g. through mold vias or printed circuit board via bars), or a passive component, such as a capacitor, inductor, or transformer. The backside or non-active side of die 110 may be exposed and not covered by the mold compound 120.

Figure 2A:
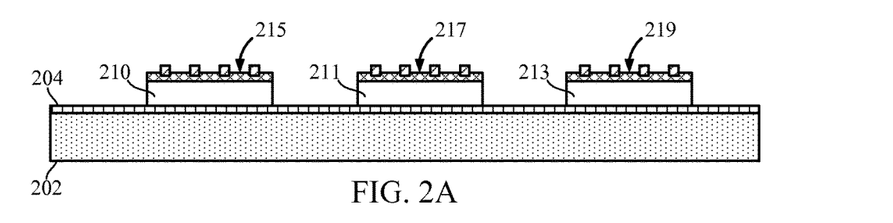
FIGS. 2A-G illustrate an exemplary method for manufacturing an integrated package with a face up die coupled to a nearby component where the mold compound is partially removed before formation of the cavity in accordance with some examples of the disclosure.
Figure 2B:
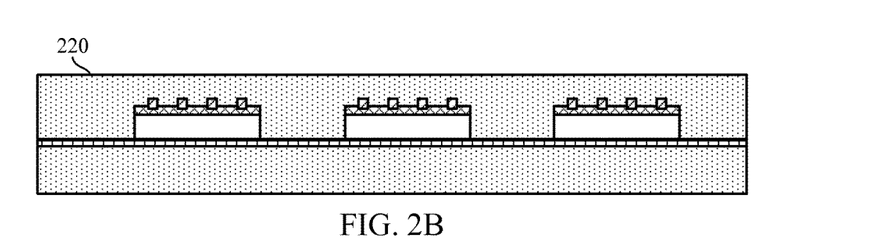

FIGS. 2A-G illustrate an exemplary method for manufacturing an integrated package 200 with a face up die coupled to a nearby component where the mold compound is partially removed before formation of the cavity in accordance with some examples of the disclosure. As shown in FIG. 2A, the partial process flow begins with a carrier 202. A first adhesive layer 204 is applied to a first surface of the carrier 202 followed by the placement a first die 210, a second die 211, and a third die 213 on the first adhesive layer 204 with an active side 215 of the first die 210, an active side 217 of the second die 211, and an active side 219 of the third die 213 in a face up orientation. While the figure shows the first die 210, the second die 211, and the third die 213, it should be understood that the process may include only the first die 210 or more than three die as desired. As shown in FIG. 2B, a mold compound 220 is applied on top of the first adhesive layer 204 to cover the first die 210, the second die 211, and the third die 213.

Figure 2C:
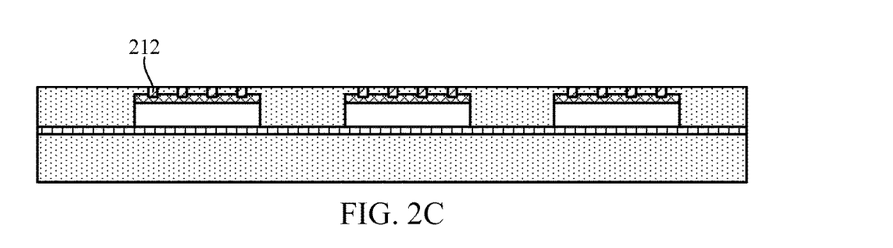
Figure 2D:
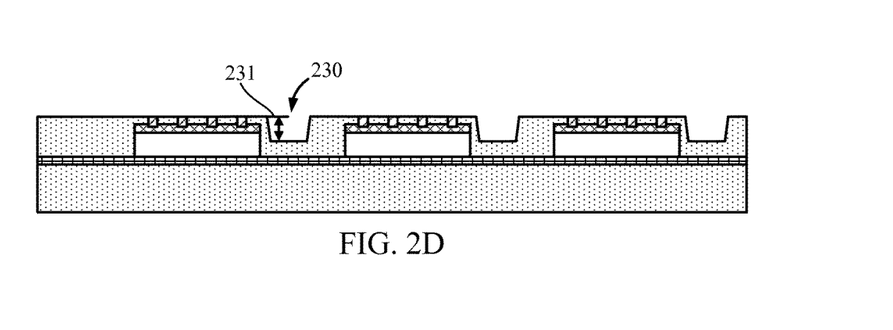

As shown in FIG. 2C, a first portion of the mold compound is removed to expose a plurality of interconnects 212 on the active side of the die, such as the active side 215 of the first die 210. The plurality of interconnects 212 may be copper pillars or similar electrically conductive material and structure. Next in FIG. 2D, a plurality of cavities 230 are formed in the mold compound 220 proximate to each of the first die 210, the second die 211, and the third die 213. While three cavities 230 are shown in the figure, it should be understood that a single cavity 230, two cavities 230, or more than three cavities 230 may be formed depending on how many additional components may be added to the integrated package 200. Each cavity 230 extends from a surface of the mold compound 220 a first distance 231 that is less than a height of the first die 230, for example. This will allow subsequent backside grinding without grinding the cavity and potentially damaging any component placed in the cavity prior to the backside grinding. The cavities 230 may be formed by laser ablation, mechanical drilling, chemical etching, or similar processes that selectively remove only a portion of the mold compound 220.

Figure 2E:
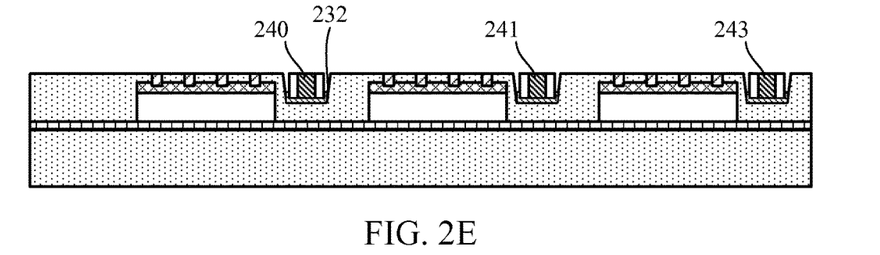
Figure 2F:
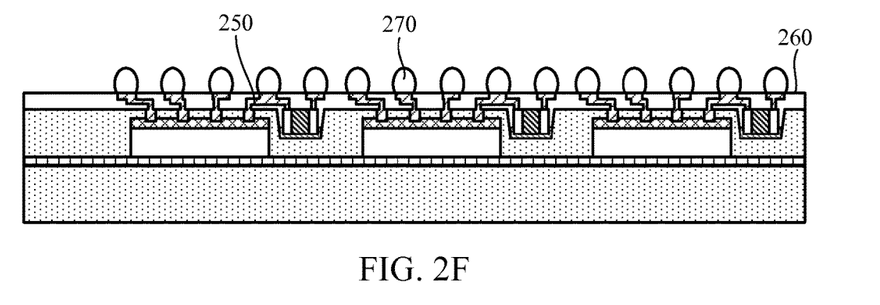
Figure 2G:
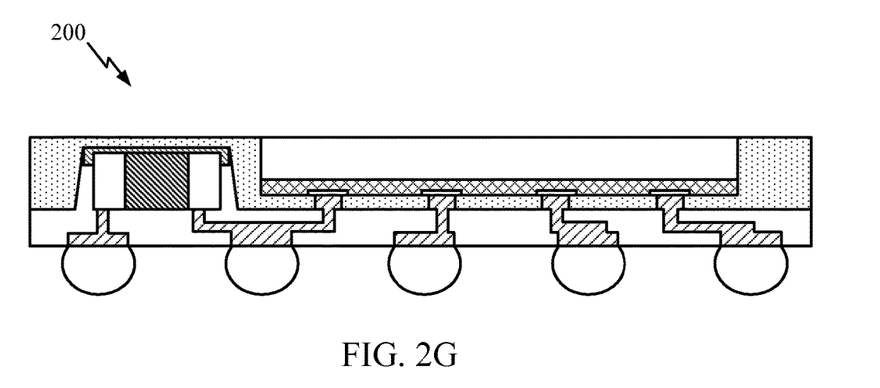

As shown in FIG. 2E, the partial process continues with the application of a second adhesive layer 232 in the bottom of the cavities 230 followed by the placement of a first component 240, a second component 241, and a third component 243 in each of the cavities 230, respectively. Alternatively, the second adhesive layer 232 may be applied to a bottom of the components before placement. The first component 240, the second component 241, and the third component 243 may be a logic die (similar to die 210 for example), a memory, pre-formed via bars (e.g. through mold vias or printed circuit board via bars), or a passive component, such as a capacitor, inductor, or transformer. The first component 240, the second component 241, and the third component 243 are placed such that a top surface of each component is co-planar with the top surface of the plurality of interconnects 212 and the mold compound 220. The co-planar alignment will allow an even surface for subsequent RDL formation and processing that reduces manufacturing complexity and costs. As shown in FIG. 2F, a RDL layer 250 is formed and coupled to the plurality of interconnects 212 and the first component 240, the second component 241, and the third component 243. The RDL layer 250 provides electrical pathways that couple, for example, the first die 210 to the first component 240 along with external connections, such as solder balls 270. After or during formation of the RDL layer 250, a dielectric layer 260 is applied on the mold compound 220 to cover the RDL 250 and fill in the empty spaces on the sides of the first component 240, the second component 241, and the third component 243 such that the first component 240, the second component 241, and the third component 243 do not directly contact the mold compound 220. This isolation of the first component 240, for example, provides an increase in the electrical properties due to the added dielectric material and prevents potential intermetallic degradation of the first component during subsequent processes and operation along with avoiding problems created by air cavities or gaps during subsequent heat treatment. After formation of the RDL 250 and the dielectric layer 260, a plurality of solder balls 270 may be formed and coupled to the RDL 250 to provide external connections, such as to a printed circuit board or another integrated package in a package on package structure. As shown in FIG. 2G, the carrier 202 and adhesive layer 204 are removed from the work piece and a backside grinding process is conducted to remove portions of the mold compound 240 along with portions of the first die 210, the second die 211, and the third die 213 until a desired package thickness is obtained without reaching the cavities 230 and risking damage to the components in the cavities 230. The work piece can then be singulated with a saw, for example, to form individual integrated packages 200.

Figure 3A:
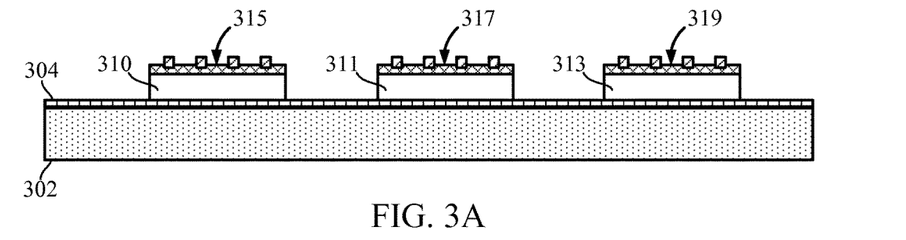
FIGS. 3A-F illustrate an exemplary method for manufacturing an integrated package with a face up die coupled to a nearby component where the mold compound is partially removed after formation of the cavity in accordance with some examples of the disclosure.
Figure 3B:
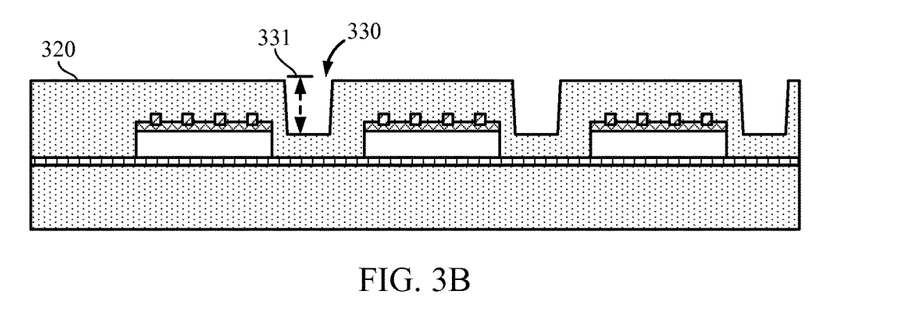

FIGS. 3A-F illustrate an exemplary method for manufacturing an integrated package 300 with a face up die coupled to a nearby component where the mold compound is partially removed after formation of the cavity in accordance with some examples of the disclosure. As shown in FIG. 3A, the partial process flow begins with a carrier 302. A first adhesive layer 304 is applied to a first surface of the carrier 302 followed by the placement a first die 310, a second die 311, and a third die 313 on the first adhesive layer 304 with an active side 315 of the first die 310, an active side 317 of the second die 311, and an active side 319 of the third die 313 in a face up orientation. As shown in FIG. 3B, a mold compound 320 is applied on top of the first adhesive layer 304 to cover the first die 310, the second die 311, and the third die 313. Next, a plurality of cavities 330 are formed in the mold compound 320 proximate to each of the first die 310, the second die 311, and the third die 313. Each cavity 330 extends from a surface of the mold compound 320 a first distance 331 to a point past the active side 315 of the first die 330, for example, without reaching the adhesive layer 304. This will allow subsequent backside grinding without grinding the cavity and potentially damaging any component placed in the cavity prior to the backside grinding.

Figure 3C:
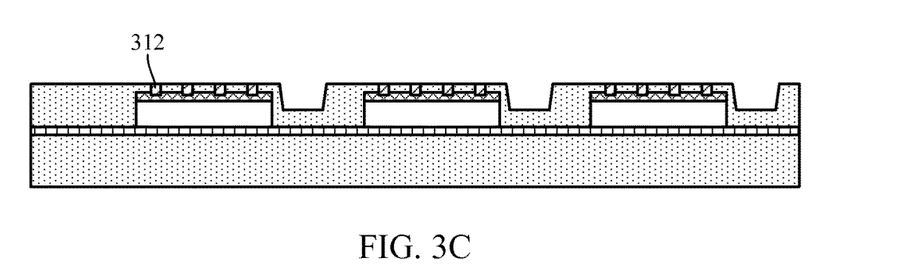
Figure 3D:
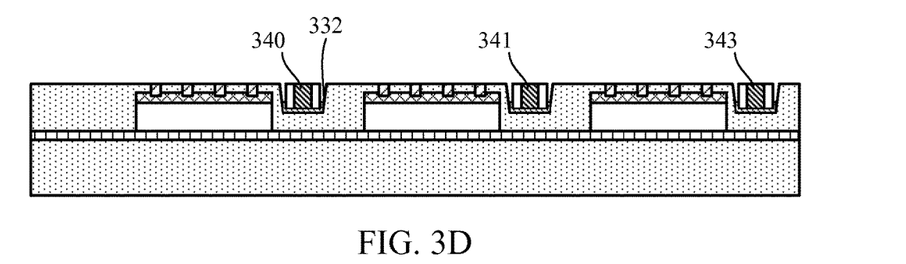
Figure 3E:
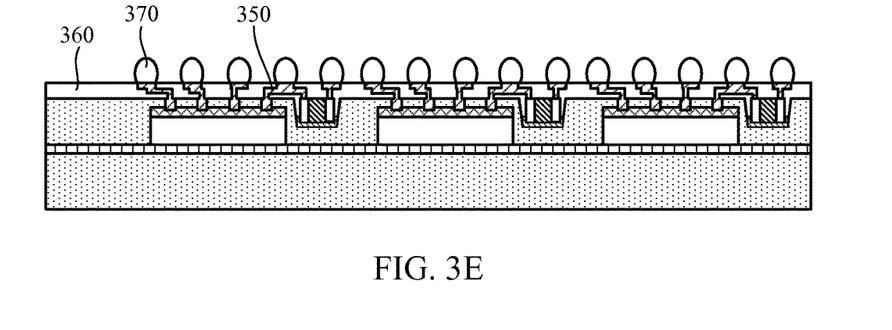
Figure 3F:
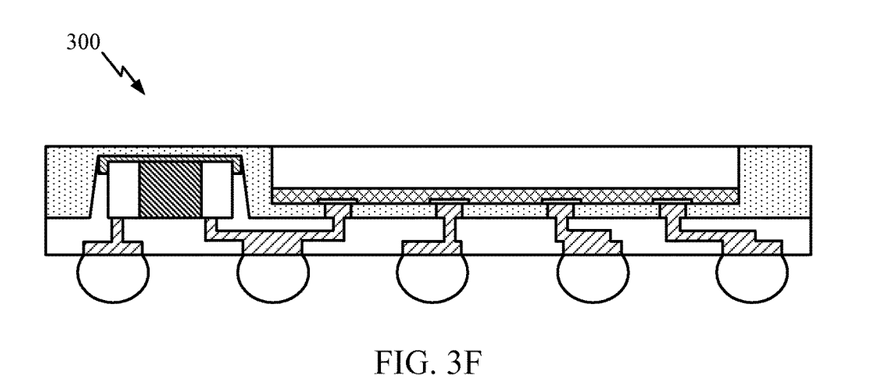

As shown in FIG. 3C, a first portion of the mold compound is removed to expose a plurality of interconnects 312 on the active side of the die, such as the active side 315 of the first die 310. The plurality of interconnects 312 may be copper pillars or similar electrically conductive material and structure. Next in FIG. 3D, the partial process continues with the application of a second adhesive layer 332 in the bottom of the cavities 330 followed by the placement of a first component 340, a second component 341, and a third component 343 in each of the cavities 330, respectively. The first component 340, the second component 341, and the third component 343 are placed such that a top surface of each component is co-planar with the top surface of the plurality of interconnects 312 and the mold compound 320. The co-planar alignment will allow an even surface for subsequent RDL formation and processing that reduces manufacturing complexity and costs. As shown in FIG. 3E, a RDL layer 350 is formed and coupled to the plurality of interconnects 312 and the first component 340, the second component 341, and the third component 343. The RDL layer 350 provides electrical pathways that couple, for example, the first die 310 to the first component 340 along with external connections, such as solder balls 370. After or during formation of the RDL layer 350, a dielectric layer 360 is applied on the mold compound 320 to cover the RDL 350 and fill in the empty spaces on the sides of the first component 340, the second component 341, and the third component 343 such that the first component 340, the second component 341, and the third component 343 do not directly contact the mold compound 320 because of the isolation provided by the second adhesive layer 332 and the dielectric layer 360 surrounding each component. This isolation of the first component 340, for example, provides an increase in the electrical properties due to the added dielectric material and prevents potential intermetallic degradation of the first component during subsequent processes and operation along with avoiding problems created by air cavities or gaps during subsequent heat treatment. After formation of the RDL 350 and the dielectric layer 360, a plurality of solder balls 370 may be formed and coupled to the RDL 350 to provide external connections, such as to a printed circuit board or another integrated package in a package on package structure. As shown in FIG. 3F, the carrier 302 and adhesive layer 304 are removed from the work piece and a backside grinding process is conducted to remove portions of the mold compound 340 along with portions of the first die 310, the second die 311, and the third die 313 until a desired package thickness is obtained without reaching the cavities 330 and risking damage to the components in the cavities 330. The work piece can then be singulated with a saw, for example, to form individual integrated packages 300.

Figure 4A:
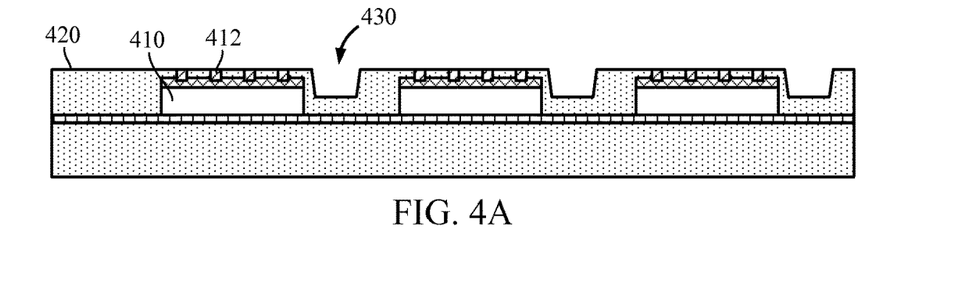
FIGS. 4A-D illustrate an exemplary method for manufacturing an integrated package with a face up die coupled to a nearby component using a component placement tool that mechanically aligns the placed component with a top surface of the mold compound with and without coining in accordance with some examples of the disclosure.
Figure 4B:
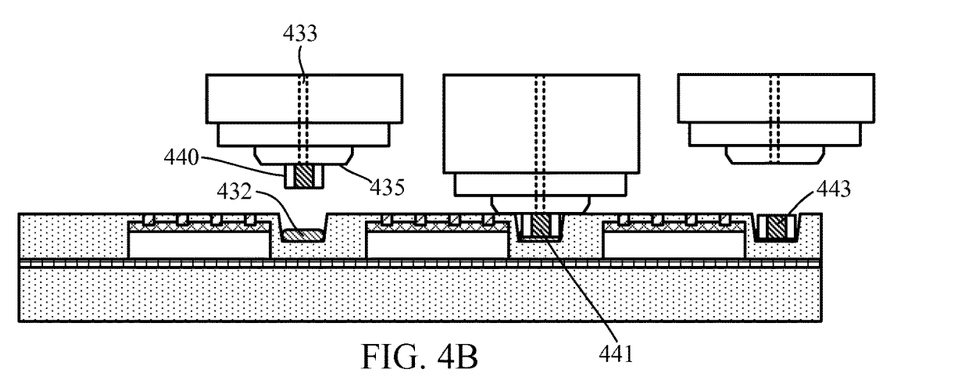
Figure 4C:
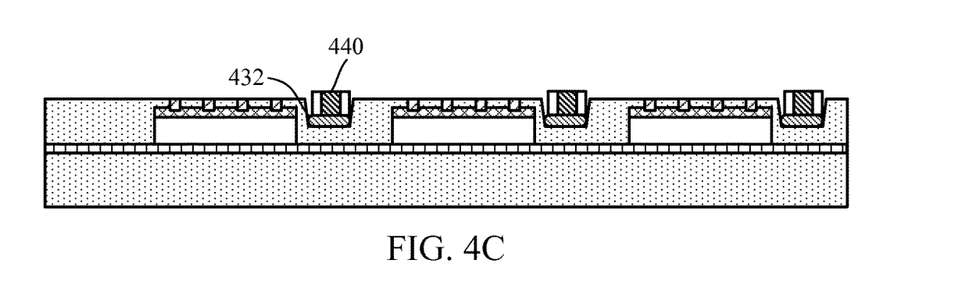
Figure 4D:
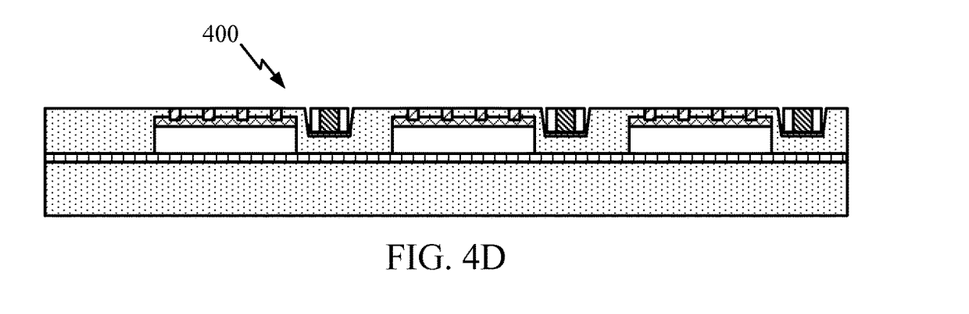

FIGS. 4A-D illustrate an exemplary method for manufacturing an integrated package with a face up die coupled to a nearby component using a component placement tool that mechanically aligns the placed component with a top surface of the mold compound with and without coining in accordance with some examples of the disclosure. As shown in FIG. 4A, the partial process begins with a partially formed structure, such as the structure after the processes shown in FIG. 2D and FIG. 3C (i.e. before placement of any components). At this stage, the work piece includes an exposed plurality of interconnects 412 of a first die 410 proximate to a cavity 430 in a mold compound 420. As shown in FIG. 4B, the partial process continues with the application of a second adhesive layer 432 in the bottom of the cavities 430 followed by the placement of a first component 440, a second component 441, and a third component 443 in each of the cavities 430, respectively. The placement of the first component 440, the second component 441, and the third component 443 is accomplished using a placement tool 433 that has a first shoulder 435. The first shoulder 435 provides a mechanical alignment mechanism that will contact the surface of mold compound 420 such that a top surface of each component is co-planar with the top surface of the plurality of interconnects 412 and the mold compound 420 (as shown in FIG. 4B and 4D) or slightly above the plane of the top surface of the plurality of interconnects 412 and the mold compound 420 (as shown in FIG. 4C). The second adhesive layer 432 should be of suitable properties to hold the third component 443, for example, in place after the placement tool 433 has retracted. FIG. 4C shows one alternative where the placement of the first component 440 is slightly above the plane of the mold compound 420. In this alternative, a mechanical coining process to push the first component 440, for example, into the second adhesive layer 432 such that the top surface of first component 440 is co-planar with the top surface of the plurality of interconnects 412 and the mold compound 420 as shown in FIG. 4D. The co-planar alignment will allow an even surface for subsequent RDL formation and processing that reduces manufacturing complexity and costs.

Figure 5:
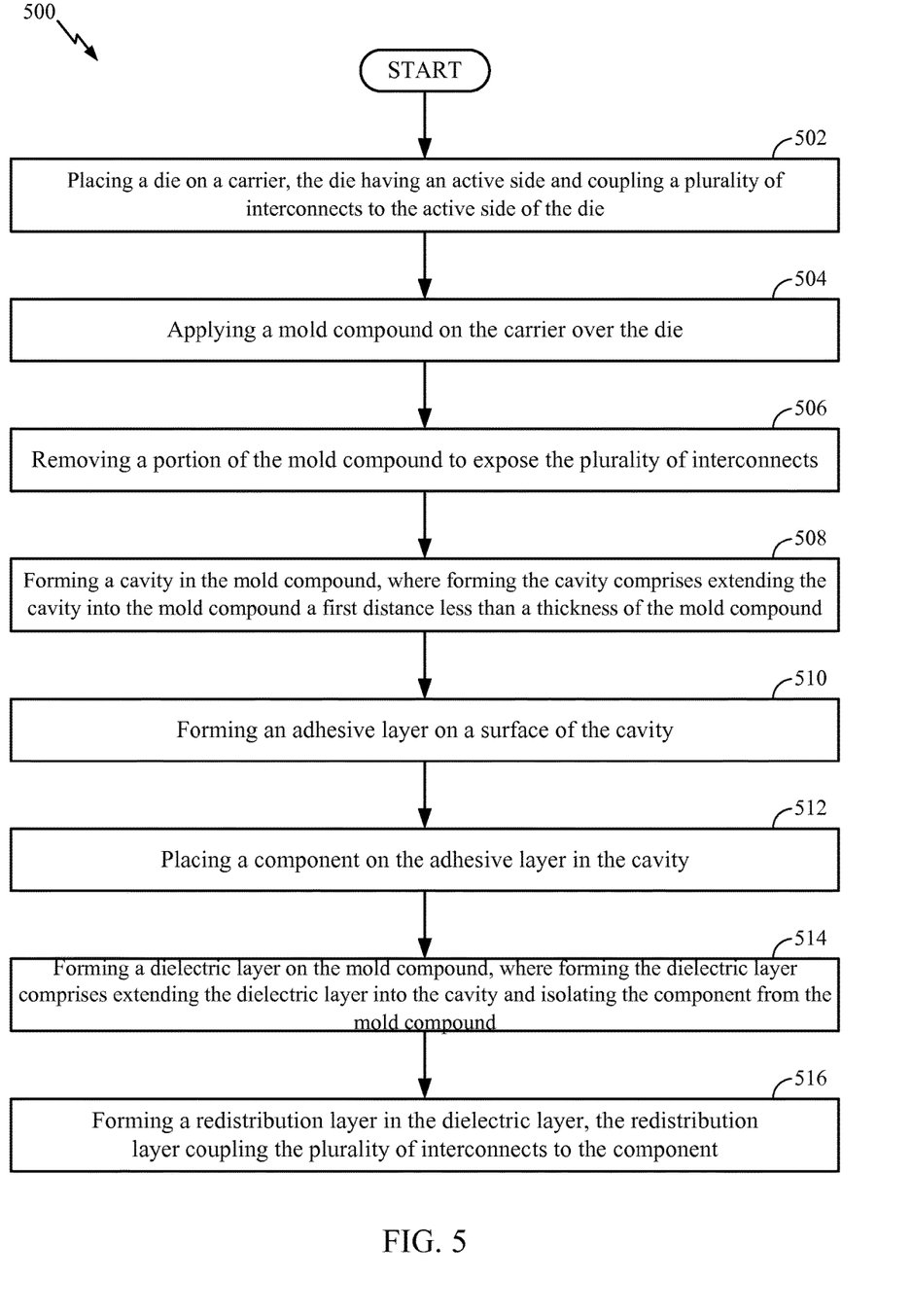
FIG. 5 illustrates an exemplary method for manufacturing an integrated package with a face up die coupled to a nearby component where the mold compound is partially removed before formation of the cavity in accordance with some examples of the disclosure.

FIG. 5 illustrates an exemplary method 500 for manufacturing an integrated package. As shown in block 502, the method begins with placing a die on a carrier, the die having an active side and a plurality of interconnects on the active side. In block 504, the method continues with applying a mold compound on the carrier covering the die. Followed by removing a portion of the mold compound to expose the plurality of interconnects in block 506. In block 508, the method continues with forming a cavity in the mold compound proximate to the die, the cavity extending into the mold compound a first distance less than a thickness of the mold compound. In block 510, the method continues with forming an adhesive layer on a bottom of the cavity. In block 512, the method continues with placing a component on the adhesive layer in the cavity. In block 514, the method continues with forming a dielectric layer on the mold compound, the dielectric layer extending into the cavity such the component is isolated from the mold compound. In block 516, the method concludes with forming a redistribution layer in the dielectric layer, the redistribution layer coupling the plurality of interconnects to the component.

Figure 6:
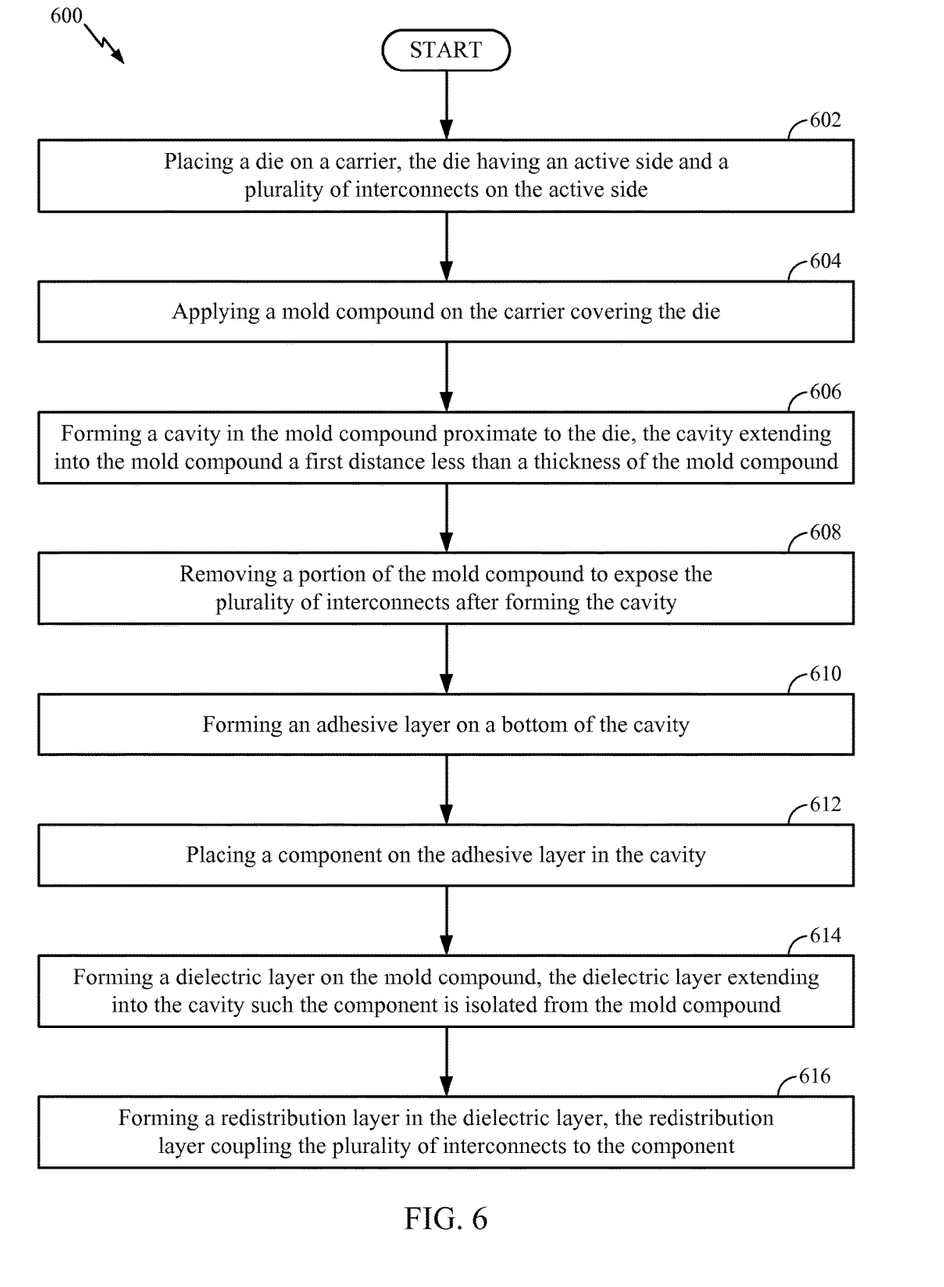
FIG. 6 illustrates an exemplary method for manufacturing an integrated package with a face up die coupled to a nearby component where the mold compound is partially removed after formation of the cavity in accordance with some examples of the disclosure.

FIG. 6 illustrates an exemplary method 600 for manufacturing an integrated package As shown in block 602, the method begins with placing a die on a carrier, the die having an active side and a plurality of interconnects on the active side. In block 604, the method continues with applying a mold compound on the carrier covering the die. Followed by forming a cavity in the mold compound adjacent to the die, the cavity extending into the mold compound a first distance less than a thickness of the mold compound in block 606. In block 608, the method continues with removing a portion of the mold compound to expose the plurality of interconnects after forming the cavity. In block 610, the method continues with forming an adhesive layer on a bottom of the cavity. In block 612, the method continues with placing a component on the adhesive layer in the cavity. In block 614, the method continues with forming a dielectric layer on the mold compound, the dielectric layer extending into the cavity such the component is isolated from the mold compound. In block 616, the method concludes with forming a redistribution layer in the dielectric layer, the redistribution layer coupling the plurality of interconnects to the component.

In this description, certain terminology is used to describe certain features. The term "mobile device" can describe, and is not limited to, a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). Further, the terms "user equipment" (UE), "mobile terminal," "mobile device," and "wireless device," can be interchangeable.

Figure 7:
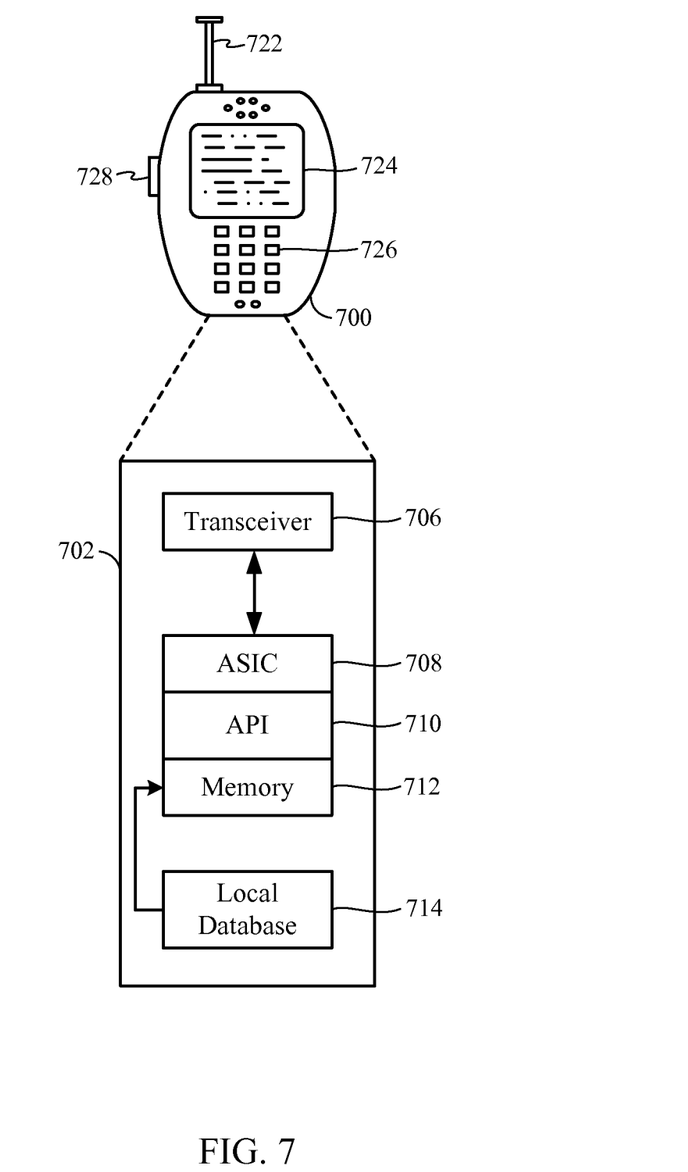
FIG. 7 illustrates exemplary user equipment (UE) in accordance with some examples of the disclosure.

Integrated packages according to the examples above (e.g. the integrated package 100, the integrated package 200, the integrated package 300, and the integrated package 400) can be used for a number of different applications, such as in the circuit components of a mobile device. Referring to FIG. 7 as an example, a system 700 may include an UE 701, (here a wireless device), which has a platform 702 that can receive and execute software applications, data and/or commands transmitted from a radio access network (RAN) that may ultimately come from a core network, the Internet and/or other remote servers and networks. Platform 702 can include transceiver 706 operably coupled to an application specific integrated circuit ("ASIC" 708), or other processor, microprocessor, logic circuit, or other data processing device. ASIC 708 or other processor executes the application programming interface ("API") 710 layer that interfaces with any resident programs in memory 712 of the wireless device. Memory 712 can be comprised of read-only or random-access memory (RAM and ROM), EEPROM, flash cards, or any memory common to computer platforms. Platform 702 also can include local database 714 that can hold applications not actively used in memory 712. Local database 714 is typically a flash memory cell, but can be any secondary storage device as known in the art, such as magnetic media, EEPROM, optical media, tape, soft or hard disk, or the like. Internal platform 702 components can also be operably coupled to external devices such as antenna 722, display 724, push-to-talk button 728 and keypad 726 among other components, as is known in the art.

As stated above, integrated packages according to the examples above (e.g. the integrated package 100, the integrated package 200, the integrated package 300, and the integrated package 400) can be used for a number of different applications, such as the circuit components of the UE 701 including, but not limited to, transceiver 706, ASIC 708, memory 712, and local database 714.

The wireless communication between UE 701 and the RAN can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE) or other protocols that may be used in a wireless communications network or a data communications network.

Figure 8:
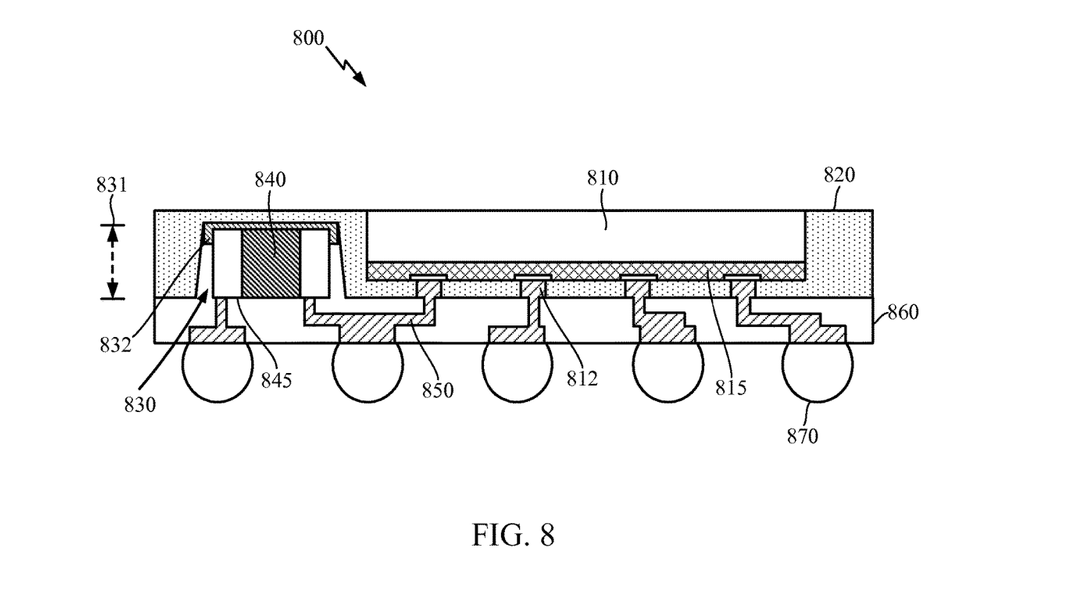
FIG. 8 illustrates an exemplary integrated package with a face up die coupled to a nearby component located in a cavity of the mold compound in accordance with some examples of the disclosure.

FIG. 8 illustrates an exemplary integrated package with a face up die coupled to a nearby component located in a cavity of the means for encapsulation in accordance with some examples of the disclosure. As shown in FIG. 8, an integrated package 800 may include a die 810 having an active side 815 and a means for interconnection 812 of the die 810 (e.g. plurality of interconnects 112, plurality of interconnects 212, plurality of interconnects 312, and plurality of interconnects 412) extending from the active side 815, and a means for encapsulation 820 of at least part of the die 810 (e.g. mold compound 120, mold compound 220, mold compound 320, mold compound 420). The active side 815 is the part of the die 810 that contains the active components of the die 810 (e.g. transistors, resistors, capacitors etc.), which perform the operation or function of the die 810. The means for encapsulation 820 has a cavity 830 nearby or spaced from the die 810 and a component 840 located in the cavity 830. Means for coupling 850 (e.g. redistribution layer 150, redistribution layer 250, redistribution layer 350, redistribution layer 450) may electrically couple the die 810 to the component 840 or may electrically couple the die 810 and the component 840 to any other device coupled to the integrated package 800 (e.g. through the means for interconnection 812 and/or through solder balls 870). A means for isolation 860 (e.g. dielectric layer 160, dielectric layer 260, dielectric layer 360, dielectric layer 460) at least partially surrounding the means for coupling 850 and may be formed on a surface of the means for encapsulation 820. The integrated package may also have a plurality of solder balls 870 on the means for isolation 860 coupled to the means for coupling 850 for external connections.

The cavity 830 may have an opening co-planar with the means for interconnection 812 and the cavity may extend from the opening a first distance 831 into the means for encapsulation 820 such that the first distance 831 is less than a thickness of the means for encapsulation 820. The component 840 may be located in the cavity 830 such that at least a portion of a means for connection 845 (e.g. connection 145, connection 245, connection 345, connection 445) of the component 840 is co-planar with the means for interconnection 812. In addition, the cavity 830 may have an adhesive layer 832 (e.g. die attach film or adhesive paste) on at least a portion of its surface that secures the component 840 in the cavity 830 and a portion of the means for isolation 860 may extend into the cavity to isolate sides of the component 840 from the means for encapsulation 820. The means for coupling 850 may be coupled to the means for interconnection 812 and the component 830 providing an electrical pathway for signals between the die 810 and the component 830 as well as external connections. The die 810 may be a logic die or similar integrated circuit component and the component 840 may be a logic die, a memory, pre-formed via bars (e.g. through mold vias or printed circuit board via bars), or a passive component, such as a capacitor, inductor, or transformer. The backside or non-active side of die 810 may be exposed and not covered by the means for encapsulation 820.

The word "exemplary" is used herein to mean "serving as an example, instance, or illustration." Any details described herein as "exemplary" is not necessarily to be construed as preferred or advantageous over other examples. Likewise, the term "examples" does not require that all examples include the discussed feature, advantage or mode of operation. Use of the terms "in one example," "an example," "in one feature," and/or "a feature" in this specification does not necessarily refer to the same feature and/or example. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples only and is not intended to be limiting of examples of the disclosure. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, operations, elements, and/or components, but do not preclude the presence or addition of one or more other features, integers, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element.

Any reference herein to an element using a designation such as "first," "second," and so forth does not limit the quantity and/or order of those elements. Rather, these designations are used as a convenient method of distinguishing between two or more elements and/or instances of an element. Thus, a reference to first and second elements does not mean that only two elements can be employed, or that the first element must necessarily precede the second element. Also, unless stated otherwise, a set of elements can comprise one or more elements.

Nothing stated or illustrated depicted in this application is intended to dedicate any component, feature, benefit, advantage, or equivalent to the public, regardless of whether the component, feature, benefit, advantage, or the equivalent is recited in the claims.

In the detailed description above it can be seen that different features are grouped together in examples. This manner of disclosure should not be understood as an intention that the claimed examples require more features than are explicitly mentioned in the respective claim. Rather, the situation is such that inventive content may reside in fewer than all features of an individual example disclosed. Therefore, the following claims should hereby be deemed to be incorporated in the description, wherein each claim by itself can stand as a separate example. Although each claim by itself can stand as a separate example, it should be noted that-although a dependent claim can refer in the claims to a specific combination with one or a plurality of claims-other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods disclosed in the description or in the claims can be implemented by a device comprising means for performing the actions of this method.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A package comprising:
    a die including an active side and a non active side, said die further comprising a plurality of interconnects that extend from the active side of the die;
    a mold compound including a cavity, the mold compound at least partially covering the die, wherein the non-active side of the die is not covered by the mold compound;
    a component in the cavity wherein a top surface of the component is co-planar with the plurality of interconnects;
    a dielectric layer on the mold compound, the dielectric layer configured to extend into the cavity such that the component is isolated from the mold compound; and
    a redistribution layer in the dielectric layer, the redistribution layer configured to couple the plurality of interconnects to the component.

2. The package of claim 1, the component further comprising:
    a connection, the component co-planar with the plurality of interconnects, the connection configured to couple the component to the redistribution layer.

3. The package of claim 1, wherein the cavity extends into the mold compound a first distance less than a thickness of the mold compound.

4. The package of claim 1, further comprising a plurality of solder balls on the dielectric layer coupled to the redistribution layer.

5. The package of claim 1, further comprising an adhesive layer on a surface of the cavity, the adhesive layer securing the component in the cavity.

6. The package of claim 1, wherein the component is one of a logic die, a memory, a via bar, a capacitor, an inductor, or a transformer.

7. The package of claim 1, wherein the package is incorporated into a device selected from a group comprising of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and an automotive device in an automotive vehicle, and further includes the device.

8. A method for manufacturing a package, the method comprising:
    placing a die on a carrier, the die having an active side;
    coupling a plurality of interconnects to the active side of the die;
    applying a mold compound on the carrier over the die;
    removing a portion of the mold compound to expose the plurality of interconnects;
    removing a portion of the mold compound to expose a non-active side of the die;
    forming a cavity in the mold compound, where forming the cavity comprises extending the cavity into the mold compound a first distance less than a thickness of the mold compound;
    forming an adhesive layer on a surface of the cavity;
    placing a component on the adhesive layer in the cavity wherein a top surface of the component is co-planar with the plurality of interconnects;
    forming a dielectric layer on the mold compound, where forming the dielectric layer comprises extending the dielectric layer into the cavity and isolating the component from the mold compound; and
    forming a redistribution layer in the dielectric layer, the redistribution layer coupling the plurality of interconnects to the component.

9. The method for manufacturing the package of claim 8, wherein the placing the component includes placing the component in the cavity such that a connection of the component is co-planar with the plurality of interconnects, the connection coupling the component to the redistribution layer.

10. The method for manufacturing the package of claim 8, wherein forming the cavity includes extending the cavity into the mold compound a first distance less than a thickness of the mold compound.

11. The method for manufacturing the package of claim 8, further comprising forming a plurality of solder balls on the dielectric layer coupled to the redistribution layer.

12. The method for manufacturing the package of claim 8, wherein the component is one of a logic die, a memory, a via bar, a capacitor, an inductor, or a transformer.

13. A package comprising:
    a die including an active side;
    means for interconnection of the die that extends from the active side of the die;
    means for exposing a non active side of the die;
    means for encapsulation of at least part of the die;
    a component in a cavity of the means for encapsulation wherein a top surface of the component is co-planar with the means for interconnection;
    means for isolation on the means for encapsulation, the means for isolation extends into the cavity such that the component is isolated from the means for encapsulation; and
    means for coupling the die to the component, the means for coupling located in a dielectric layer.

14. The package of claim 13, the component further comprising:

means for connection of the component to the means for coupling, the component co-planar with the means for interconnection.

15. The package of claim 13, wherein the cavity extends into the means for encapsulation a first distance less than a thickness of the means for encapsulation.

16. The package of claim 13, further comprising a plurality of solder balls on the means for isolation coupled to the means for coupling.

17. The package of claim 13, further comprising an adhesive layer on a surface of the cavity, the adhesive layer securing the component in the cavity.

18. The package of claim 13, wherein the component is one of a logic die, a memory, a via bar, a capacitor, an inductor, or a transformer.

* * * * *